United States Patent [19]
Cho

[11] Patent Number: 5,493,535
[45] Date of Patent: Feb. 20, 1996

[54] MEMORY ADDRESSING METHOD AND APPARATUS THEREFOR

[75] Inventor: Jun-hyoung Cho, Suwon, Rep. of Korea

[73] Assignee: Samsung Electronics Co., Ltd., Suwon, Rep. of Korea

[21] Appl. No.: 361,229

[22] Filed: Dec. 21, 1994

[30] Foreign Application Priority Data

Dec. 24, 1993 [KR] Rep. of Korea ............... 1993-29587

[51] Int. Cl.[6] .................................................. G11C 13/00
[52] U.S. Cl. ................ 365/230.04; 365/203; 365/230.03
[58] Field of Search ............................ 365/189.11, 203, 365/230.03, 230.04, 230.08

[56] References Cited

U.S. PATENT DOCUMENTS 5,416,746  5/1995  Sato et al. ..................... 365/230.04

Primary Examiner—Terrell W. Fears
Attorney, Agent, or Firm—Rothwell, Figg, Ernst & Kurz

[57] ABSTRACT

A memory addressing method and apparatus therefor having a pair of cell blocks is characterized in that the pair of cell blocks are alternately column-addressed in such a manner that the column line of one cell block is pre-charged while the column line of the other cell block is addressed, and that subsequently, the pre-charged column line of the other cell block is addressed while the next column line of the one cell block is pre-charged. Therefore, the memory device wherein a plurality of cell blocks are alternately addressed can achieve an approximately doubled speed of operation.

14 Claims, 10 Drawing Sheets

MEMORY ADDRESSING METHOD AND APPARATUS THEREFOR

BACKGROUND OF THE INVENTION

The present invention relates to a memory addressing method and apparatus therefor, and more particularly, to a method of addressing a dynamic random access memory (DRAM) or a video random access memory (VRAM) for use in computer graphics application, and the apparatus therefor.

The DRAM should be provided with a refresh signal and thus requires a complex interfacing circuit therefor. However, since a DRAM can achieve four times the integration that a static random access memory (SRAM) can, DRAMs are widely adopted for use in the main memory of a computer system which requires a large capacity memory device. DRAM chips were originally introduced as a single-bit input/output method, but a four-bit input/output method was gradually instituted thereafter, which ultimately led to the TMS44C257 chip by Texas Instruments which is a dual four-bit input/output device.

FIG. 1 shows an internal configuration of a conventional DRAM with a dual four-bit input and output device. The conventional DRAM has a row address buffer 100 and column address buffer 110 for receiving and buffering a nine-bit external address signal ADD, a column decoder 120 for receiving and decoding the nine-bit column address signal $YA_8$ to $YA_0$ from the column address buffer 110 and thereby accessing column addresses, a first cell block 130 and second cell block 140, an input/output buffer 150 for buffering four-bit input and output signals of the first and second cell blocks 130 and 140 to selectively input and output the same in response to the most significant bit (MSB) signal $XA_8$ of a nine-bit row address signal $XA_8$ to $XA_0$ supplied from the row address buffer 100, and a timing and control circuit 160 for receiving external timing and control signals /RAS, /CAS, /W and /G and generating internal timing and control signals. The first and second cell blocks each include two row decoders 132 and 142 for receiving an eight-bit row address signal $XA_7$ to $XA_0$ excluding the most significant bit $XA_8$ from the row address buffer 100 and decoding the same, four 128K cell arrays 134 and 144 and four sense-amplifiers 136 and 146.

Referring to FIG. 2, the read operation of a conventional DRAM having the aforementioned configuration will now be described.

The external address signal $A_8$ to $A_0$ is buffered at the falling edge of the row address strobe signal /RAS by the row address buffer 100 and the buffered row address signal $XA_8$ to $XA_0$ is transmitted to row decoders 132 and 142 to then be decoded, thereby activating the decoded row (word) line of cell arrays 134 and 144. Subsequently, the external address signal $A_8$ to $A_0$ is buffered at the falling edge of the column address strobe signal /CAS by the column address buffer 110 and the buffered column address signal $YA_8$ to $YA_0$ is transmitted to column decoder 120 to then be decoded, thereby activating the decoded column (bit) line of cell arrays 134 and 144. Therefore, the cell being at the intersection of the activated row line and activated column line is accessed, and the data in the accessed cell is transmitted to input/output buffer 150 via sense-amplifiers 136 and 146. The input/output buffer 150 in response to MSB signal $XA_8$ of the row address buffer 100 selectively outputs a four-bit output signal of the first and second cell blocks 130 and 140.

In such a read operation, since the row address signal and column address signal are supplied externally for every access operation to access the corresponding cells, the charge and discharge period ("a" of FIG. 2) of a row line becomes an invalid operation period, thereby increasing the access cycle. Therefore, when only column addresses are changed sequentially in an ascending series in the same row line, as shown in FIG. 3, by repeatedly activating the column address strobe signal /CAS during the activation state (low) of the row address strobe signal /RAS, the charge and discharge time of a row line is eliminated, thereby enabling a high-speed access operation which is known as a page mode. Specifically, the page mode is mainly used for repeatedly accessing sequential addresses, as in a VRAM.

However, the aforementioned page mode also requires a predetermined duration for the invalid period ("b" of FIG. 3) which extends from one column accessing to the next. For example, in sequentially reading the data from adjacent cells having addresses (0,0) and (0,1) in FIG. 1, a predetermined waiting interval is required after accessing address (0,0) and before accessing address (0,1) in order to prevent the data from colliding. This "wait" state is necessary since the column charged by column address "0" for accessing address (0,0) in the respective cell blocks 130 and 140 must be completely discharged and then the next column "1" must be charged so that address (0,1) may be accessed thereafter. That is, each column line needs a charge and discharge time.

Meanwhile, since the cell blocks 130 and 140 are simultaneously column-addressed by a single column decoder 120, four-bit output signals of the accessed cell blocks 130 and 140 reach input/output buffer 150 at the same time. Therefore, if the input/output buffer 150 outputs the four-bit output signal of the cell block 130, first, the four-bit output signal of the cell block 140 should wait, which results in increasing the accessing time by as much as the wait interval.

Also, since an external new column address signal should be input even for sequential addresses of an ascending series, for each accessing operation, external control is difficult to achieve.

In particular, in a dual port VRAM by which data is transmitted from the central processing unit through a random port and display data is transmitted to a cathode ray tube through a serial port, sequential addresses of an ascending series are repeated. Therefore, high-speed accessing and easy external control are required for obtaining high-resolution of cathode ray tubes.

SUMMARY OF THE INVENTION

To solve the problem of the conventional art, it is an object of the present invention to provide a memory addressing method enabling a high-speed accessing.

Another object of the present invention is to provide a dual port DRAM having a high accessing speed.

To accomplish the above object, the memory addressing method according to the present invention is characterized in that a pair of cell blocks are alternately column-addressed in such a manner that the column line of one cell block is precharged while the column line of the other cell block is addressed, and that subsequently, the pre-charged column line of the other cell block is addressed while the next column line of the one cell block is pre-charged.

Also, the device according to the present invention comprises: a plurality of cell blocks; internal row address signal generating means for generating an internal row address signal of the upper (n−1)-bit signal by counting a row clock with the value of an n-bit external row address signal as an initial value in response to a row address strobe signal; first internal column address signal generating means for generating a first (n−1)-bit internal column address signal by counting a first column clock with the value of the upper (n−1)-bit signal of n-bit external column address signals as an initial value in response to a column address strobe signal; second internal column address signal generating means for generating a second (n−1)-bit internal column address signal by counting a second column clock with the value of the upper (n−1)-bit signal of the n-bit external column address signals as an initial value in response to the column address strobe signal, and for generating a column clock as a selection control signal for selecting input and output signals of the plurality of cell blocks, in accordance with the state of the least significant bit signal of the external column address signals; row decoding means for receiving and decoding the internal row address signal, thereby addressing row addresses of the plurality of cell blocks simultaneously; first column decoding means for receiving and decoding the least significant bit signal of the row clock counted value and the first internal column address signal, thereby addressing the column address of one cell block of the plurality of cell blocks; second column decoding means for receiving and decoding the least significant bit signal of the row clock counted value and the second internal column address signal, thereby addressing the column address of the other cell block of the plurality of cell blocks; input/output buffering means for selecting input and output signals of the plurality of cell blocks in response to said selection control signal; and control signal generating means for generating the row and column address signals, row and column clocks and an internal control signal by receiving external row and column address strobe signals, external row and column clocks, and an external control signal.

According to the present invention, column lines of different cell blocks are alternately driven and pre-charged. Also, an internal address signal is generated to then be addressed, by counting clocks internally without further receiving another external address signal once one external address signal is received. Therefore, a high-speed operation having no data collision is achieved.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

First, as described above, the memory addressing method according to the present invention is characterized in that a pair of cell blocks are alternately column-addressed in such a manner that the column line of one cell block is pre-charged while the column line of the other cell block is addressed, and that subsequently, the pre-charged column line of the other cell block is addressed while the next column line of the one cell block is pre-charged.

In more detail, in the addressing method of the memory device having a plurality of cell blocks, whereby the respective cell blocks are alternately addressed, internal row address signal $XA_7$ to $XA_0$ of the upper (n−1)-bit signal is generated from the counted value $Q_8$ to $Q_0$ by counting a row clock RC with the value of an n-bit external row address signal ADD as an initial value in response to a row address strobe signal /RAS. A first (n−1)-bit internal column address signal $YA_7$ to $YA_0$ is generated by counting a first column clock CCA with the value of the upper (n−1)-bit signal $A_8$ to $A_1$ of n-bit external column address signals ADD as an initial value in response to a column address strobe signal /CAS. A second (n−1)-bit internal column address signal $YA_7$ to $YA_0$ is generated by counting a second column clock CCB with the value of the upper (n−1)-bit signal $A_8$ to $A_1$ of n-bit external column address signals ADD as an initial value in response to the column address strobe signal /CAS. A column clock is generated as a selection control signal SE for selecting input and output signals of the plurality of cell blocks, in accordance with the state of the least significant bit signal A0 of the external column address signals ADD. Row addresses of the plurality of cell blocks are simultaneously addressed by receiving and decoding the internal row address signal $XA_7$ to $XA_0$. The column address of one cell block among the plurality of cell blocks is addressed by receiving and decoding the least significant bit signal $Q_0$ of the row clock counted value and the first internal column address signal $YA_7$ to $YA_0$. The column address of the other cell block among the plurality of cell blocks is addressed by receiving and decoding the least significant bit signal $Q_0$ of the counted value of the row clock and the second internal column address signal $YA_7$ to $YA_0$. The input and output signals of the plurality of cell blocks are selected in response to the selection control signal.

A preferred embodiment of the present invention will now be described.

Figure 1:
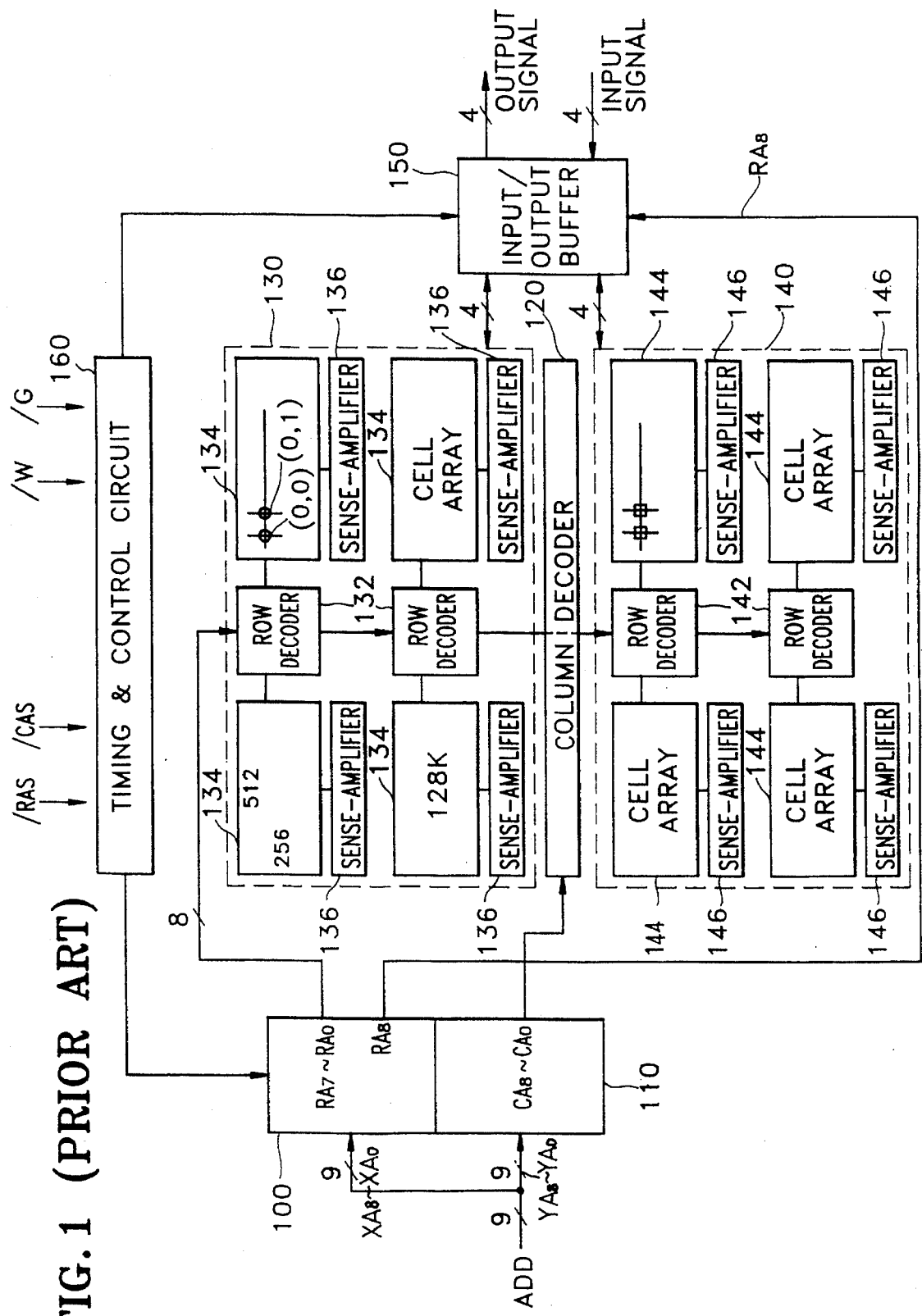
FIG. 1 is a block diagram of a conventional dynamic random access memory (DRAM)
Figure 2:
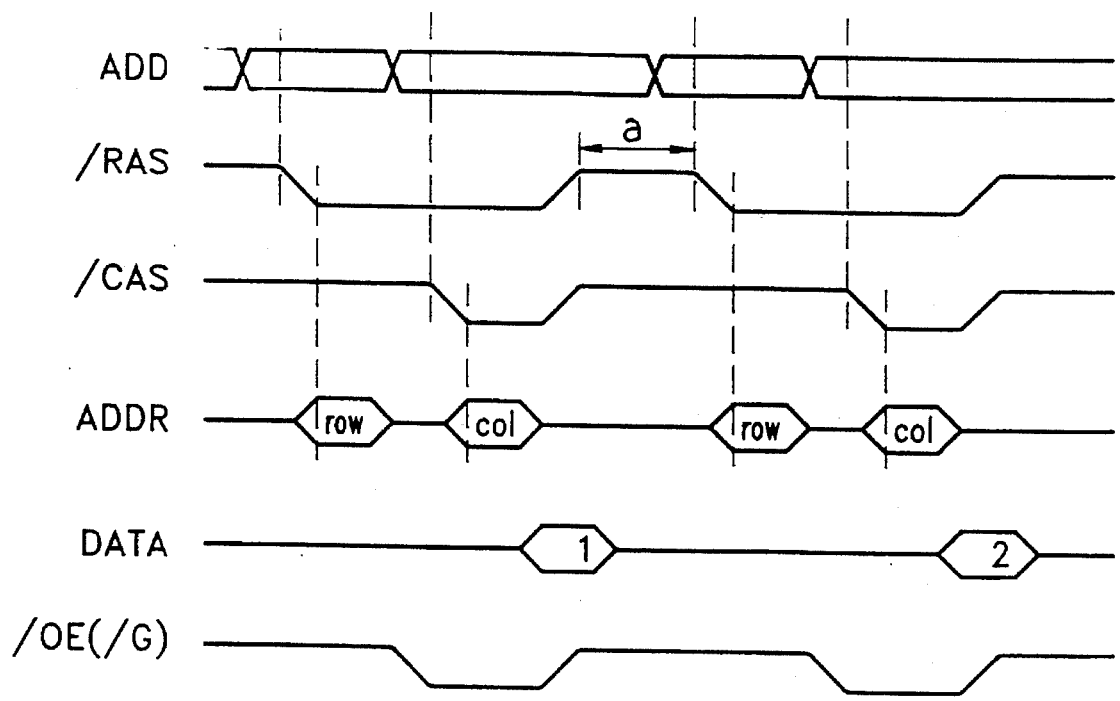
FIG. 2 shows waveform diagrams for explaining a read operation of the conventional DRAM.
Figure 3:
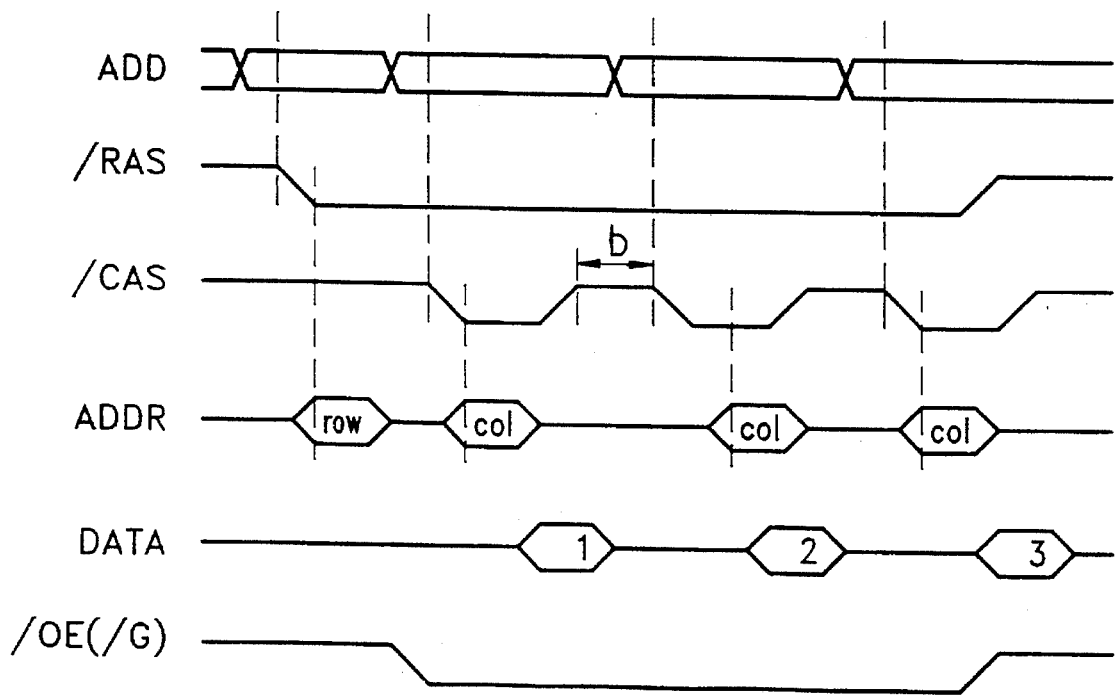
FIG. 3 shows waveform diagrams for explaining a page mode operation of the conventional DRAM.
Figure 4:
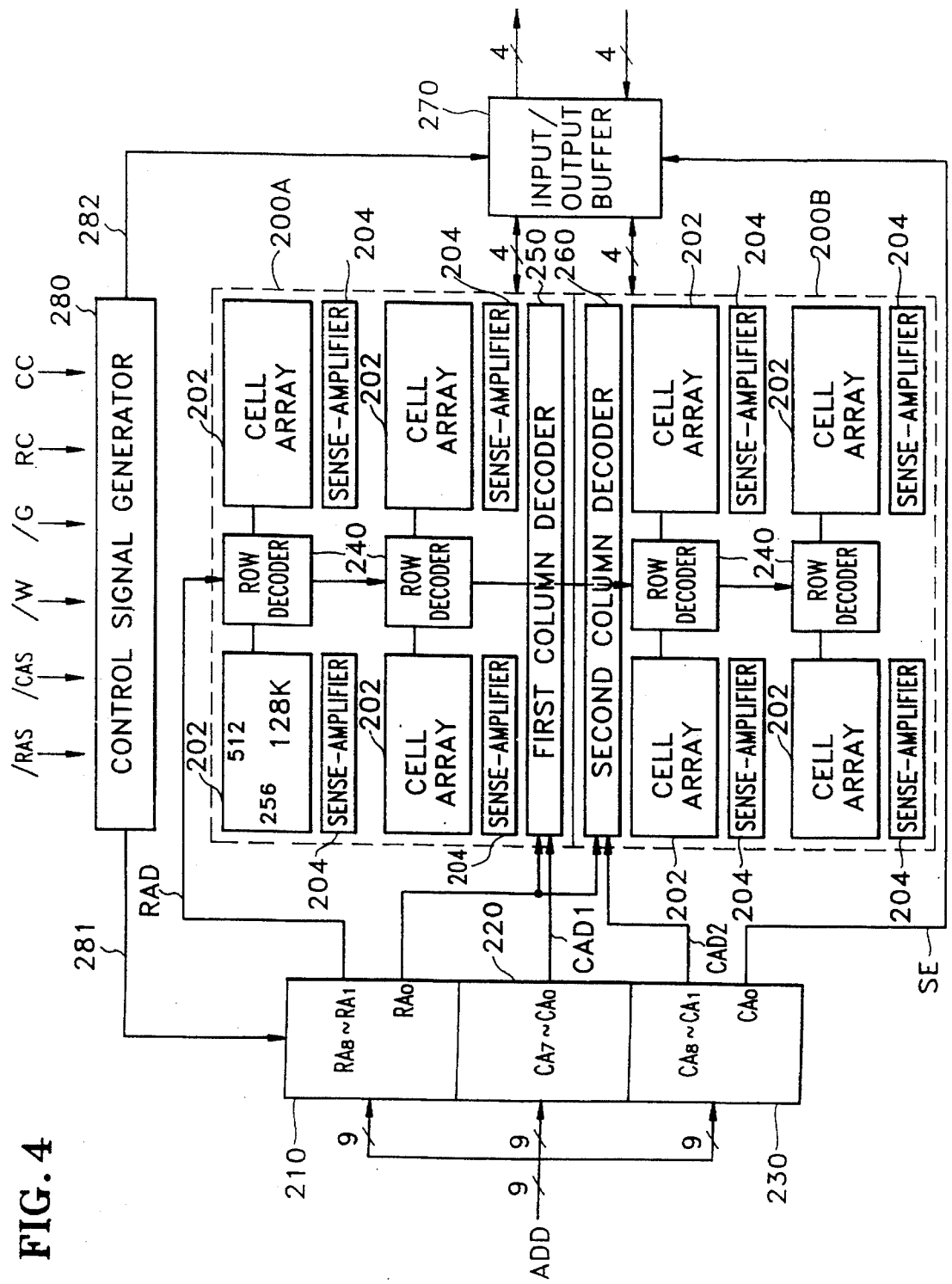
FIG. 4 is a block diagram of a DRAM according to an embodiment of the present invention.

FIG. 4 is a block diagram of the DRAM according to the present invention. The DRAM according to the present invention includes a plurality of cell blocks 200A and 200B, internal row address signal generator 210 for generating an internal row address signal RAD ($XA_7$ to $XA_0$) of the upper eight-bit signal $Q_8$ to $Q_1$ (excluding the lease significant bit signal $Q_0$) by counting a row clock RC with the value of nine-bit external row address signal ADD as an initial value in response to a row address strobe signal /RAS, a first internal column address signal generator 220 for generating a first eight-bit internal column address signal CAD1 ($YA_7$ to $YA_0$), by counting a first column clock CCA with the value of the upper eight-bit signal $A_8$ to $A_1$ of nine-bit external column address signal ADD as an initial value in response to a column address strobe signal /CAS, a second internal column address signal generator 230 for generating a second eight-bit internal column address signal CAD2 ($YA_7$ to $YA_0$), by counting a second column CCB clock with the value of the upper eight-bit signal $A_8$ to $A_1$ of the nine-bit external column address signal ADD as an initial value in response to the column address strobe signal /CAS and for generating a column clock CC as a selection control signal SE for selecting input and output signals of the plurality of cell blocks 200A and 200B in accordance with the state of the least significant bit signal $A_0$ of the external column address signals ADD, row decoder 240 for receiving and decoding the internal row address signal RAD, thereby addressing row addresses of the plurality of cell blocks 200A and 200B simultaneously, a first column decoder 250 for receiving and decoding the least significant bit signal $Q_0$ of the counted value of the row clock RC and the first internal column address signal CAD1, thereby addressing the column address of one cell block 200A of the plurality of cell blocks 200A and 200B, a second column decoder 260 for receiving and decoding the least significant bit signal $Q_0$ of the counted value of the row clock RC and the second internal column address signal CAD2, thereby addressing the column address of the other cell block 200B of the plurality of cell blocks 200A and 200B; input/output buffer 270 for selecting input and output signals of the plurality of cell blocks 200A and 200B in response to the selection control signal SE; and control signal generator 280 for receiving and buffering external row and column address strobe signals /RAS and /CAS, external row and column clocks RC and CC, and external control signals /W and /G, thereby generating a control signal.

Here, the address strobe signals /RAS and /CAS are supplied to address generator 210, 220 and 230 via a line 281. The row and column clocks RC and CC are supplied to input and output buffer 270 via a line 282. The respective cell blocks 200A and 200B include four 512×256 cell arrays 202s, four sense-amplifiers 204s, two 8-to-256 row decoders 240s, and a 9-to-512 column decoder 250. Therefore, the present invention is different from the conventional configuration in that its configuration is independent from one another divided into cell blocks and it further includes internal address generator.

Figure 5:
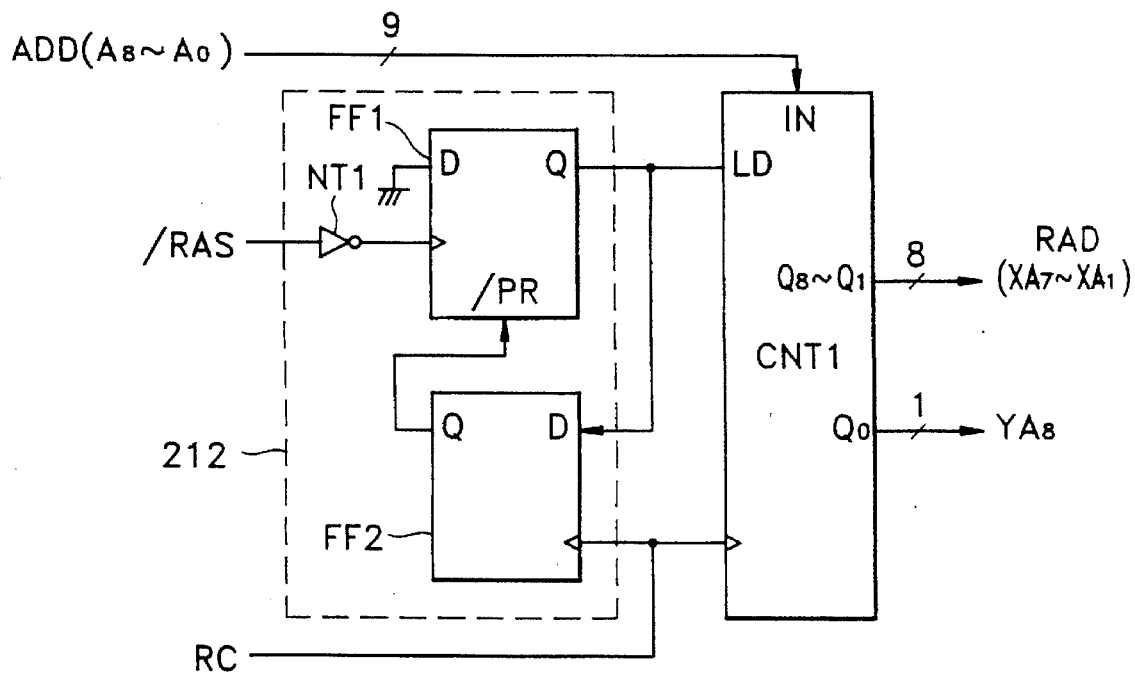
FIG. 5 is a detailed circuit diagram of the row address generator shown in FIG. 4.

Referring to FIG. 5, the row address signal generator includes a nine-bit binary counter CNT1 for receiving a nine-bit address signal ADD ($A_8$ to $A_0$), as its input in response to a load signal LD and counting a row clock RC with the received value as an initial value, and first load signal generator 212 for generating a load signal in synchronization with a row clock RC and in response to a row address strobe signal /RAS. The first load signal generator 212 includes two flip-flops FF1 and FF2 and an inverter NT1 so that an output "0" is generated at a leading edge of the row address strobe signal RAS and the output "0" is synchronized with a rising edge of the row clock RC to then be generated as a preset signal /PR to be fed back thereto, thereby changing the output "0" into an output "1" and so that a load signal LD for loading the nine-bit binary counter 212 is generated at the rising edge. In the counter CNT1, the upper eight-bit signal Qs to $Q_1$ is generated as an internal row address signal RAD ($XA_7$ to $XA_0$), and the least significant bit signal $Q_0$ is generated as a most significant bit signal $YA_8$ of an internal column address signal.

Figure 6:
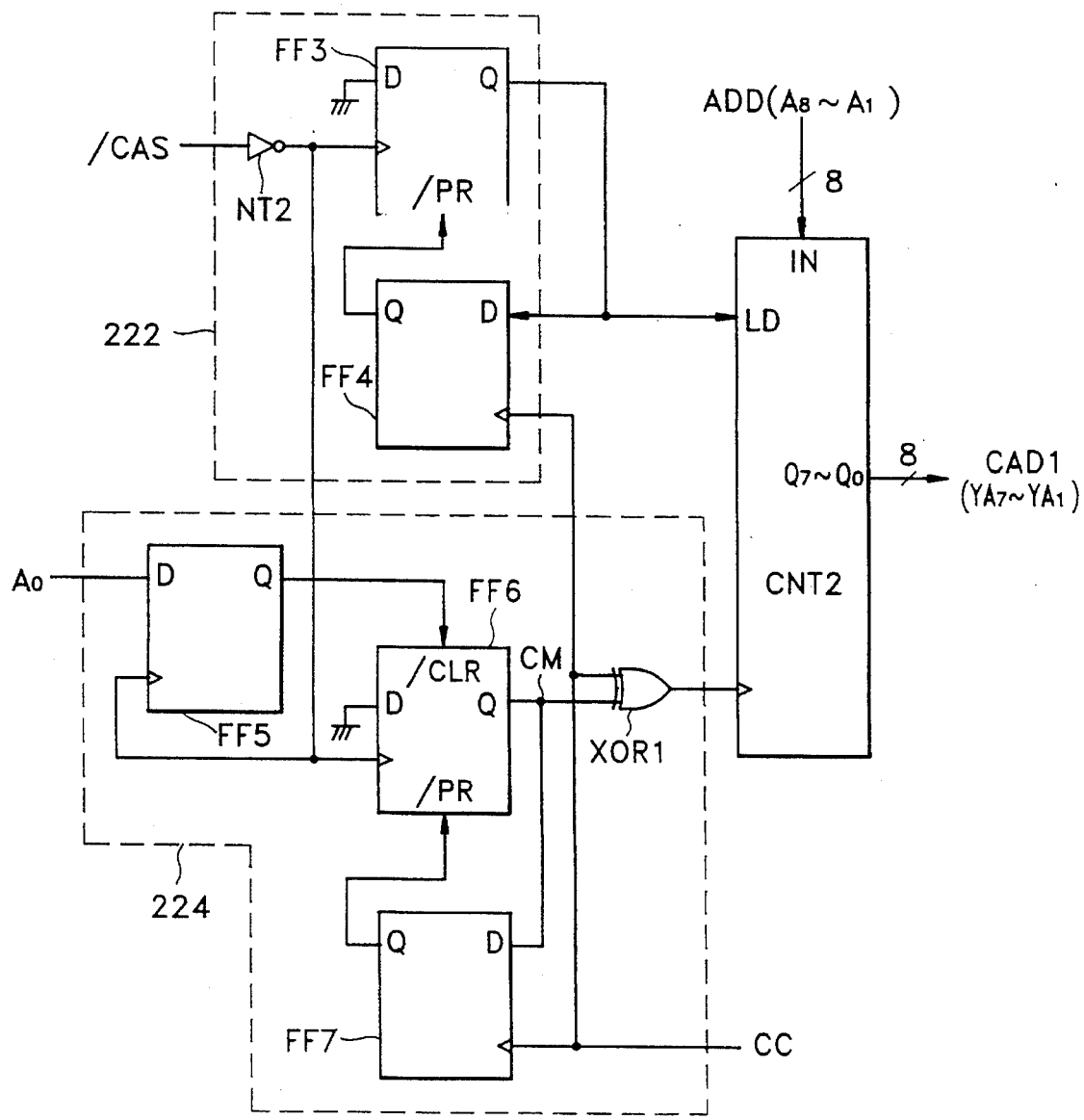
FIG. 6 is a detailed circuit diagram of the first column address generator shown in FIG. 4.

Referring to FIG. 6, first internal column address signal generator 220 includes an eight-bit binary counter CNT2 for receiving an eight-bit address signal ADD ($A_8$ to $A_1$) as its input in response to a load signal LD and counting a first column clock CCA with the received value as an initial value, second load signal generator 222 for generating a load signal LD synchronized with a column clock CC in response to a column address strobe signal /CAS, and first column clock generator 224 for generating a first column clock CCA from the column clock CC depending on the state of the least significant bit signal $A_0$ of the eight-bit address signal $A_8$ to $A_1$. The second load signal generator 222 has the same configuration as that of the first load signal generator 212 and includes two flip-flops FF3 and FF4 and an inverter NT2 so that a second load signal LD synchronized with the column clock CC, not with a row clock RC, is generated. The first column clock generator 224 includes a flip-flop FF5 for latching the least significant bit signal $A_0$ of the address signal in response to the leading edge of the column address strobe signal /CAS to thereby generate a clear signal /CLR, a flip-flop FF6 for latching a "0" in response to the leading edge of the column address strobe signal /CAS to thereby generate a clock modulation signal CM in asynchronism with respect to the clear signal /CLR and a preset signal /PR, a flip-flop FF7 for synchronizing the clock modulation signal CM to the column clock CC to thereby generate the synchronized signal as the preset signal /PR, and an exclusive logical sum circuit XOR1 for performing an exclusive logical sum operation with respect to the column clock CC and the clock modulation signal CM to thereby generate a first column clock CCA. The counter CNT2 generates an output signal Qs to $Q_1$ as a first internal column address signal CAD1 ($YA_7$ to $YA_0$).

Figure 7:
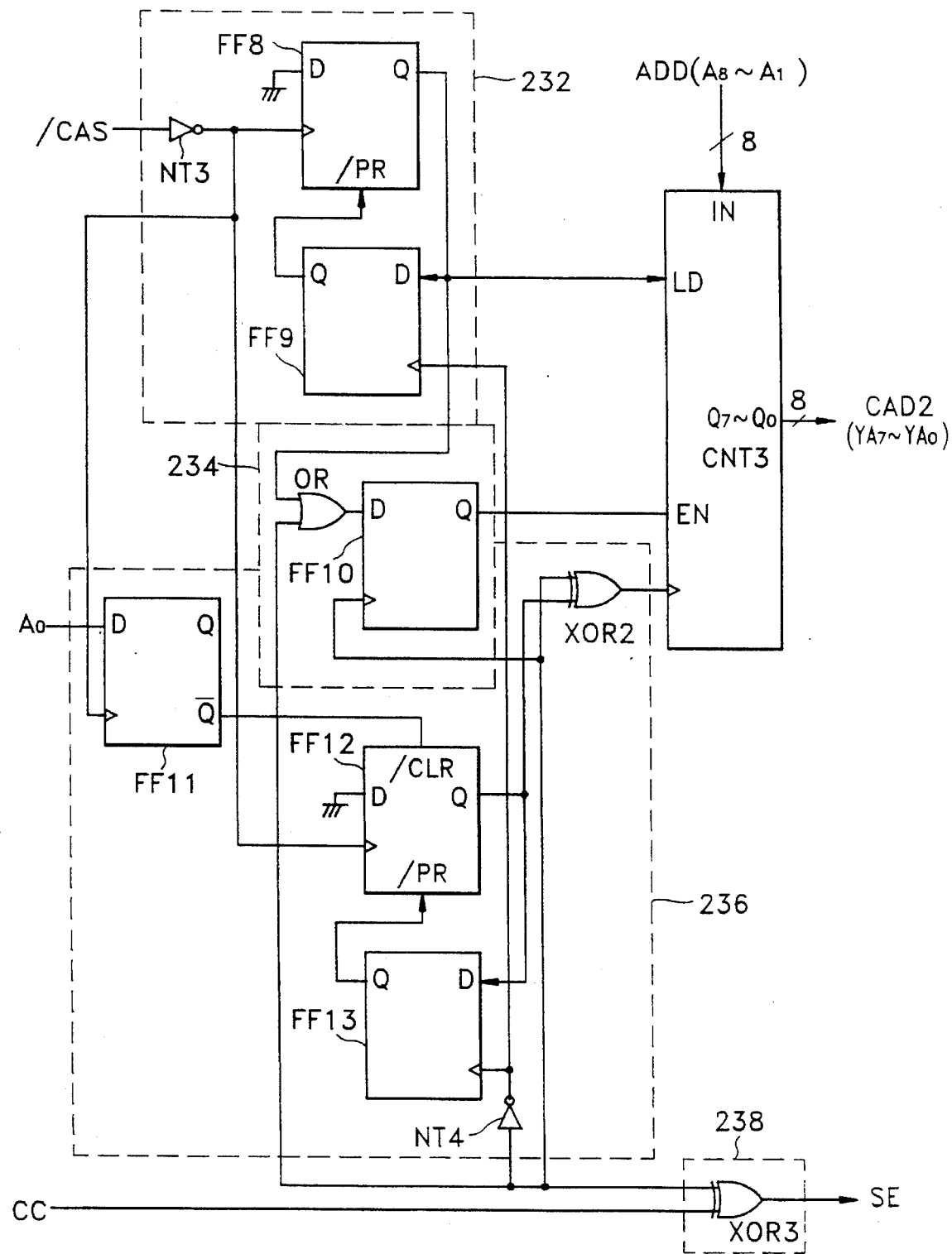
FIG. 7 is a detailed circuit diagram of the second column address generator shown in FIG. 4.

Referring to FIG. 7, the second internal column address signal generator includes an eight-bit binary counter CNT3 for receiving an eight-bit address signal ADD ($A_8$ to $A_1$), in response to a load signal LD and counting a second column clock CCB with the received signal as an initial value, third load signal generator 232 for generating a load signal LD synchronized with the column clock CC in response to a column address strobe signal /CAS, enabling means 234 for performing a logical sum operation with respect to the least significant bit signal $A_0$ of the latched address signal and the load signal, latching the logical sum signal in synchronization with the column clock to thereby generate the latched signal as an enabling signal of the counter CNT3, second column clock generator 236 for generating a second column clock CCB from the column clock CC depending on the state of the least significant bit signal $A_0$ of the address signal, and a selection control signal generator 238 for generating a selection control signal by performing an exclusive logical sum operation with respect to the least significant bit signal $A_0$ of the latched address signal and the column clock. The third load signal generator 232 has the same configuration as that of the second load signal generator 222 but is different in that it includes two flip-flops FF8 and FF9 and an inverter NT3, for generating a load signal LD synchronized with the inverted column clock /CC (which has been inverted by the t5 inverter NT4) instead of the column clock CC. The enabling signal generator 234 includes a logical sum circuit OR for performing a logical sum operation with respect to the least significant bit signal $A_0$ of the latched address signal and the load signal LD, and a flip-flop FF10 for latching the logical sum signal in synchronization with the column clock CC to thereby generate the latched signal as an enabling signal EN of the counter CNT3. The second column clock generator 236 includes a flip-flop FF11 for latching the least significant bit signal $A_0$ of the address signal in response to the leading edge of the column address strobe signal /CAS to thereby generate an inverted output signal of the latched signal as a clear signal /CLR, a flip-flop FF12 for latching a "0" in response to the leading edge of the column address strobe signal /CAS to thereby generate a clock modulation signal CM in asynchronism with respect to the clear signal /CLR and a preset signal /PR, a flip-flop FF13 for generating the clock modulation signal CM as the preset signal /PR in synchronization with the inverted column clock /CC, and an exclusive logical sum circuit XOR2 for performing an exclusive logical sum operation with respect to the column clock CC and the clock modulation signal CM to thereby generate a second column clock CCB. The counter CNT3 prevents an initial unnecessary counting by the enabling signal EN and generates an output signal $A_7$ to $A_0$ as a second internal column address signal CAD2 ($YA_7$ to $YA_0$). The selection control signal generator 238 includes an exclusive logical sum circuit XOR3 for performing an exclusive logical sum operation with respect to the least significant bit signal $A_0$ of the address signal and the column clock CC to thereby generate a selection control signal SE.

The operation and effect of an embodiment of the present invention having the aforementioned configuration will now be described with reference to FIGS. 8 and 9.

Figure 8:
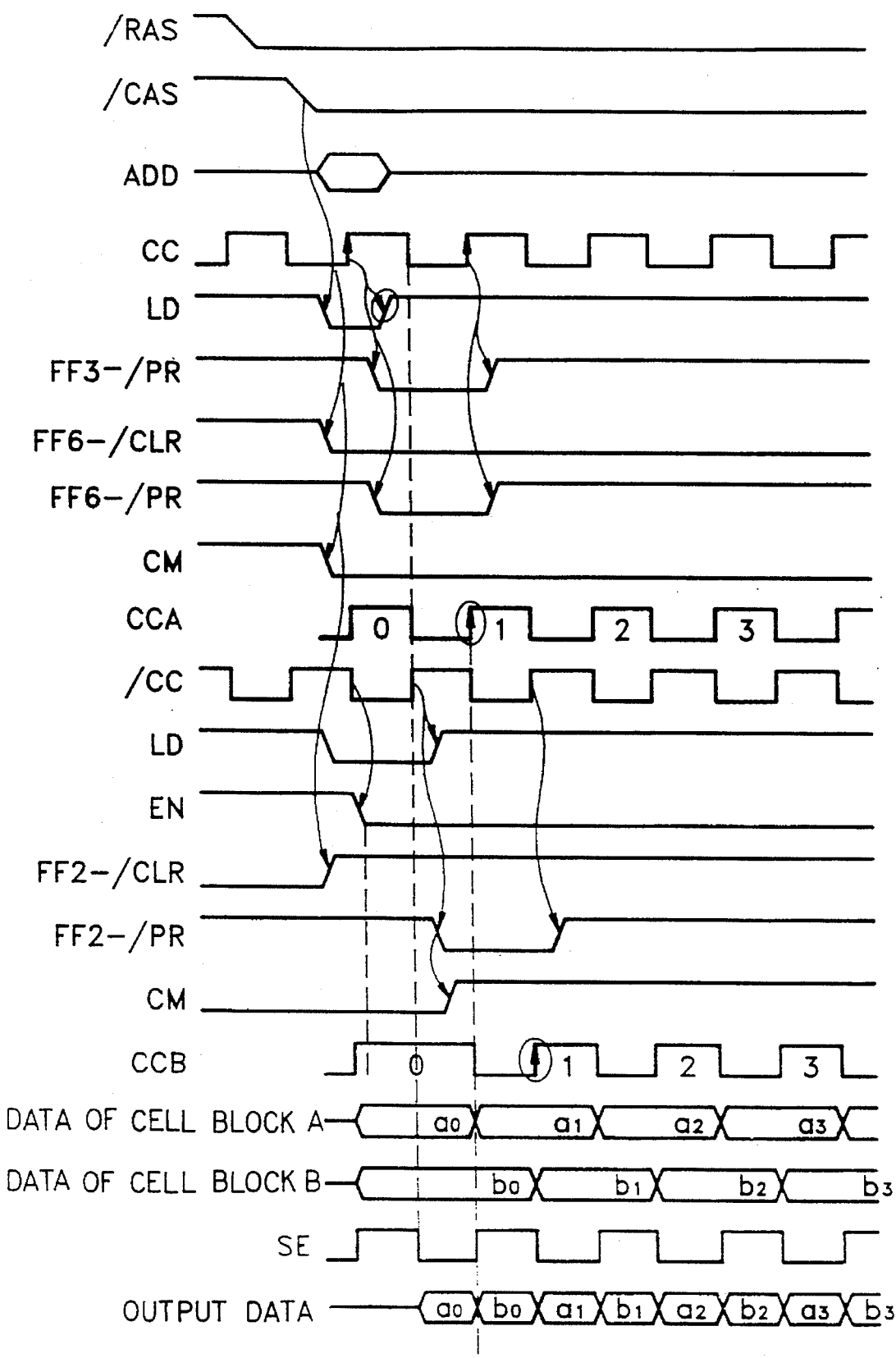
FIG. 8 shows waveform diagrams of various parts shown in FIG. 6.
Figure 9:
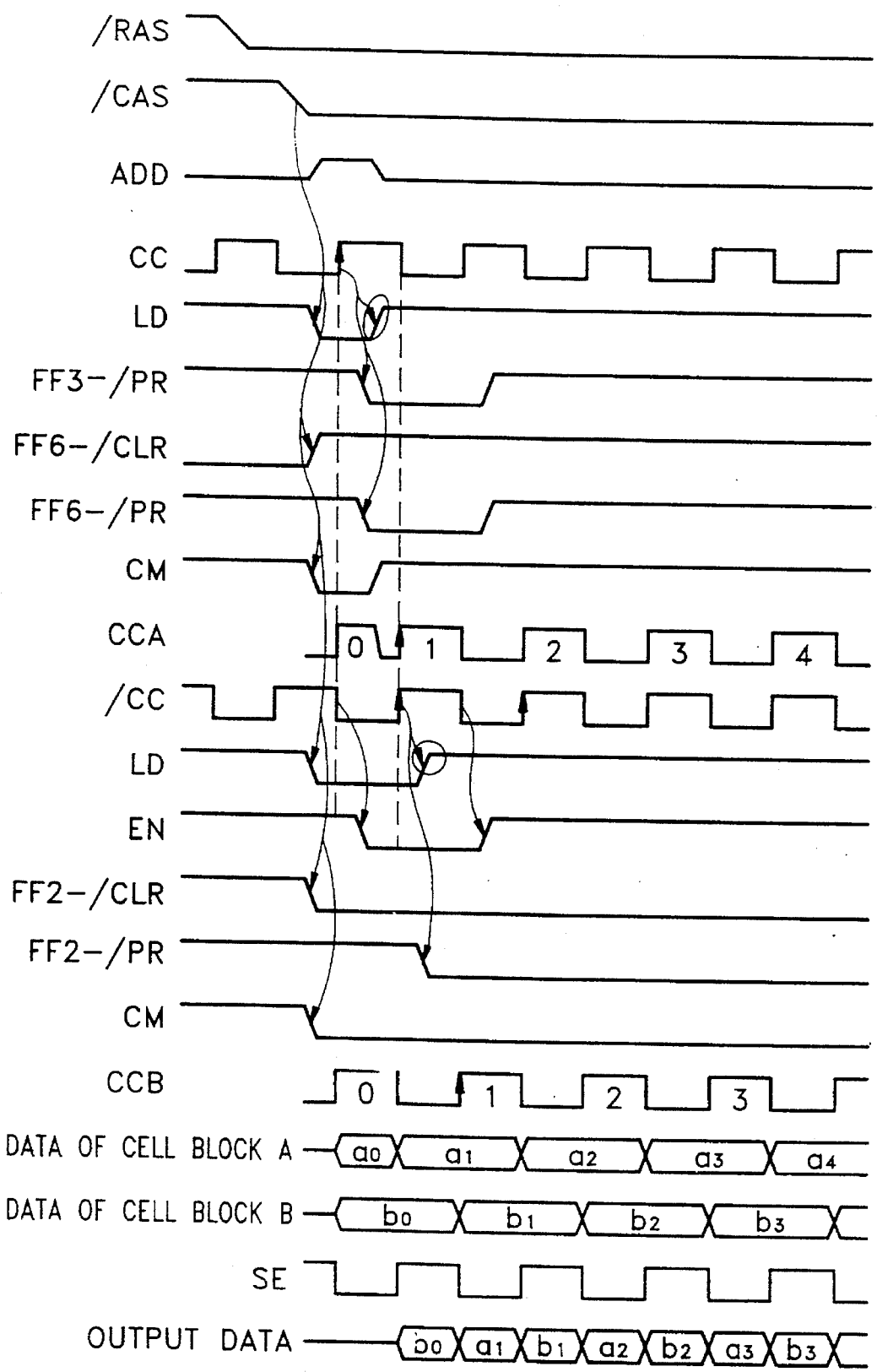
FIG. 9 shows waveform diagrams of various parts shown in FIG. 7.

Referring to FIG. 8, the address signal ADD is loaded in the internal row address signal generator 210 in response to a falling edge of row address strobe signal /RAS. The row clock RC is counted with the value of the loaded row address as an initial value. The output signal $Q_8$ to $Q_1$ of the counted value is generated as an internal row address signal RAD and the output signal of $Q_0$ is generated as the most significant bit signal $YA_8$ of the column address signal. Therefore, the row decoder 240 receives a row address signal RAD as its input and designates row address of cell blocks 200A and 200B in an ascending series from the initial value of the externally supplied row address. Meanwhile, following after the row address strobe signal /RAS, the address signal ADD is loaded in the first and second column address signal generators 220 and 230, respectively, in response to a falling edge of the column address strobe signal /CAS. The first and second column clocks CCA and CCB are counted with the value of the loaded row address as an initial value. The output signals $Q_7$ to $Q_1$ of the counted value are generated as first and second column address signals CAD1 and CAD2.

At this time, if the state of the least significant bit signal $A_0$ of the externally supplied column address signal ADD is "0," the active state of the load signal LD of the first column address signal generator 220 leads that of the load signal LD of the second column address signal generator 230 by half a cycle of the column clock CC. The second column clock CCB of the second column address signal generator 230 lags the first column clock CCA by half a cycle of the column clock CC. Thus, the first column address signal CAD1 leads the second column address signal CAD2 by half a cycle of the column clock CC. Therefore, the first column decoder 250 receives the first column address signal CAD1 and sequentially designates the column address of the first cell block 200A in an ascending series. The second column decoder 260 receives the second column address signal CAD2 and sequentially designates the column address of the second cell block 200B in an ascending series. At this time, the designation time of the second column decoder 260 is delayed by half a cycle of the column clock CC, compared to that of the first column decoder 250. Therefore, the same row addresses of the respective cell arrays 202 of the cell blocks 200A and 200B are simultaneously designated. Thereafter, the initial column line of the cell block 200A is designated by the external column address signal ADD. Subsequently, the initial column line of the cell block 200B is designated by the external column address signal ADD later than that of the cell block 200A by half a cycle, due to a loading condition delayed by half a cycle of the column clock CC. From this time, the next column line of the cell block 200B starts to be charged. Subsequently, the next charged column line of the cell block 200A is designated and the next column line of the cell block 200B starts to be charged at the same time. In this manner, cell blocks are alternately addressed in such a manner that when the column line of a cell block is designated, the column line of another cell block starts to be charged. Data $a_0, a_1, a_2, a_3, \ldots b_0, b_1, b_2, b_3, \ldots$ of the cell designated in the respective cell blocks 200A and 200B addressed by such an addressing method, are transmitted to the input/output buffer 270. The input/output buffer 270 selectively outputs data $a_0, a_1, a_2, a_3, \ldots$ supplied from the cell block 200A in the "0" period of the selection control signal SE, and selectively outputs data $b_0, b_1, b_2, b_3 \ldots$ supplied from the cell block 200B in the "1" period of the selection control signal SE. Therefore, the output data are output in the order of $a_0, b_0, a_1, b_1, a_2, b_2, a_3, b_3, \ldots$ Meanwhile, as shown in FIG. 9, if the state of the least significant bit signal $A_0$ of the externally supplied column address signal ADD is "1," in the same manner of the "0" state, the active state of the load signal LD of the first column address signal generator 220 leads the load signal LD of the second column address signal generator 230 by half a cycle of the column clock CC. The second column clock CCB of the second column address signal generator 230 lags the first column clock CCA by half a cycle of the column clock CC. However, the first clock of the first column clock CCA is generated during half a cycle of the column clock only for the purpose of increasing a counted value by one, and, the following clocks from the second clock are generated with the same frequency as that of the column clock. Thus, the first column clock is delayed by half a cycle compared to the second column clock. Therefore, the same row addresses of the respective cell arrays 202 of the cell blocks 200A and 200B are simultaneously designated. Thereafter, the initial column line of the cell block 200B is designated by the external column address signal ADD. Subsequently, the initial column line of the cell block 200A is designated by the external column address signal ADD later than that of the cell block 200B by half a cycle of the column clock CC. At this time, the next column line of the cell block 200A starts to be charged. Subsequently, the next charged column line of the cell block 200B is designated and the second next column line of the cell block 200A starts to be charged at the same time. In this manner, cell blocks are alternately addressed in such a manner that when the column line of a cell block is designated, the column line of another block starts to be charged. Data $a_0, a_1, a_2, a_3, \ldots b_0, b_1, b_2, b_3, \ldots$ of the cell designated in the respective cell blocks 200A and 200B addressed by such an addressing method, are transmitted to the input/output buffer 270. The input/output buffer 270 selectively outputs data $b_0, b_1, b_2, b_3, \ldots$ supplied from the cell block 200B in the "1" period of the selection control signal SE, and selectively outputs data $a_0, a_1, a_2, as, \ldots$ supplied from the cell block 200A in the "0" period of the selection control signal SE. Therefore, the output data are output in the order of $b_0, a_1, b_1, a_2, b_2, a_3, b_3, \ldots$ As described above, according to an embodiment of the present invention, column lines of different cell blocks are alternately driven and pre-charged. Also, internal address signals are generated to then be addressed, by counting clocks internally without further receiving another external address signal after one external address signal is received. Therefore, the high-speed operation having no data collision is enabled.

Figure 10:
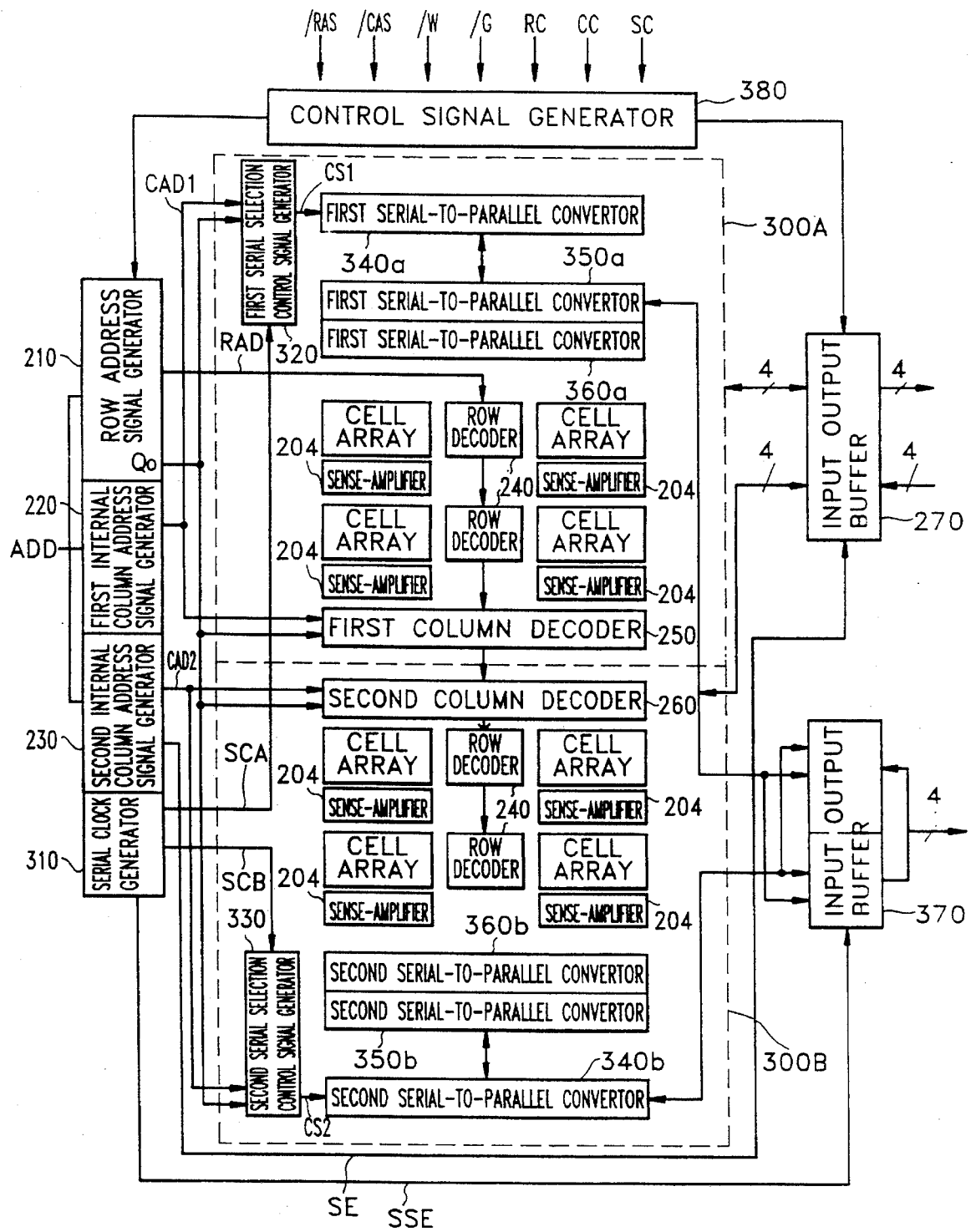
FIG. 10 is a block diagram of a VRAM according to another embodiment of the present invention.

Referring to FIG. 10, another embodiment of the present invention will now be described. In this embodiment of the present invention, like components of those corresponding to the first embodiment of the present invention are designated by the same reference numerals, and thus their description will be omitted.

In the addressing method of a dual port memory having a random port, a serial port and a plurality of cell blocks, whereby the respective cell blocks are alternately addressed, the method according to another embodiment of the present invention is composed of the steps of: generating an internal row address signal of the upper (n–1)-bit signal by counting row clock with the value of an n-bit external row address signal as an initial value in response to a row address strobe signal; generating a first (n–1)-bit internal column address signal by counting a first column clock with the value of the upper (n–1)-bit signal of n-bit external column address signals as an initial value in response to a column address strobe signal; generating a second (n–1)-bit internal column address signal by counting a second column clock with the value of the upper (n–1)-bit signal of the n-bit external column address signals as an initial value in response to the column address strobe signal, and generating a column clock as a selection control signal for selecting input and output signals of the plurality of cell blocks in accordance with the state of the least significant bit signal of the external column address signals; receiving and decoding the internal row address signal, thereby addressing row addresses of the plurality of cell blocks simultaneously; receiving and decoding the least significant bit signal of the row clock counted value and the first internal column address signal, thereby addressing the column address of one cell block of the plurality of cell blocks; receiving and decoding the least significant bit signal of the row clock counted value and the second internal column address signal, thereby addressing the column address of the other cell block of the plurality of cell blocks; selecting input and output signals of the plurality of cell blocks in response to the selection control signal; generating mutually inverted first and second internal serial clocks from an external serial clock depending on the state of the least significant bit signal of external column address signal in response to the column address strobe signal; generating a first serial selection control signal by receiving the least significant bit signal of the row address signal and the first internal column address signal and counting the first internal serial clock from the received value; generating a second serial selection control signal by receiving the least significant bit signal of the row address signal and the second internal column address signal and counting the second internal serial clock from the received value; serial-to-parallel converting row data of one cell block in response to the first serial selection control signal; serial-to-parallel converting row data of another cell block in response to the second serial selection control signal; and inputting and outputting serially whereby the serial converted serial data pairs are alternately selected in response the serial input and output selection control signal.

In a dual port memory device having a random port, a serial port and a plurality of cell blocks, the device according to another embodiment of the present invention includes an internal row address signal generator for generating an internal row address signal of the upper (n–1)-bit signal by counting row clock with the value of an n-bit external row address signal as an initial value in response to a row address strobe signal, a first internal column address signal generator for generating a first (n–1)-bit internal column address signal by counting a first column clock with the value of the upper (n–1)-bit signal of n-bit external column address signals as an initial value in response to a column address strobe signal, a second internal column address signal generator for generating a second (n–1)-bit internal column address signal by counting a second column clock with the value of the upper (n–1)-bit signal of the n-bit external column address signals as an initial value in response to the column address strobe signal, and generating a column clock as a selection control signal for selecting input and output signals of the plurality of cell blocks in accordance with the state of the least significant bit signal of the external column address signals, a row decoder for receiving and decoding the internal row address signal, thereby addressing row addresses of the plurality of cell blocks simultaneously, a first column decoder for receiving and decoding the least significant bit signal of the row clock counted value and the first internal column address signal, thereby addressing the column address of one cell block of the plurality of cell blocks, a second column decoder for receiving and decoding the least significant bit signal of the row clock counted value and the second internal column address signal, thereby addressing the column address of the other cell block of the plurality of cell blocks, an input and output buffer for selecting input and output signals of the plurality of cell blocks in response to the selection control signal, a serial clock generator for generating mutually inverted first and second internal serial clocks from external serial clock depending on the state of the least significant bit signal of external column address signal in response to the column address strobe signal, first serial selection control signal generator for generating a first serial selection control signal by receiving the least significant bit signal of the row address signal and the first internal column address signal and counting the first internal serial clock from the received value, second serial selection control signal generator for generating a second serial selection control signal by receiving the least significant bit signal of the row address signal and the second internal column address signal and counting the second internal serial clock from the received value, a first serial-to-parallel convertor for serial-to-parallel converting row data of one cell block in response to the first serial selection control signal, a second serial-to-parallel convertor for serial-to-parallel converting row data of another cell block in response to the second serial selection control signal, a serial input and output buffer for alternately selecting the serial converted serial data pairs in response to the serial input and output selection control signal, and a control signal generator for generating the row and column address signals, row and column clocks, a serial clock and an internal control signal by receiving external row and column address strobe signals, external row and column clocks, an external serial clock and an external control signal.

The device according to another embodiment of the present invention includes a plurality of cell blocks 300A and 300B, row address signal generator 210, first internal column address signal generator 220, second internal column address signal generator 230, row decoder 240, first column decoder 250, second column decoder 260, an input and output buffer 270, serial clock generator 310 for generating mutually inverted first and second internal serial clocks SCA and SCB from serial clock SC depending on the state of the least significant bit signal $A_0$ of external column address signal ADD in response to the column address strobe signal /CAS, and for generating a serial input and output selection control signal SSE, first serial selection control signal generator 320 for generating a first serial selection control signal CS1 by receiving the least significant bit signal $Q_0$ of the row address signal generator 210 and the first internal column address signal CAD1 ($YA_7$ to $YA_0$), of the first internal column address signal generator 220 and counting the first internal serial clock SCA from the received value, second serial selection control signal generator 330 for generating a second serial selection control signal CS2 by receiving the least significant bit signal $Q_0$ of the row address signal generator 210 and the second internal column address signal CAD2 of the second internal column address signal generator 230, and counting the second internal serial clock SCA from the received value, first serial-to-parallel convertor 340a, 350a and 360a for serial-to-parallel converting row data of one cell block 300A in response to the first serial selection control signal CS1, second serial-to-parallel convertor 340b, 350b and 360b for serial-to-parallel converting row data of another cell block 300B in response to the second serial selection control signal CS2, serial input/output buffer 370 for alternately selecting serial data of the first and second serial-to-parallel convertor in response to the serial input/output selection control signal SSE, and control signal generator 380 for receiving and buffering external row and column address strobe signals /RAS and /CAS, external row and column clocks RC and CC, an external serial clock SC and external control signals /W and /G.

Figure 11:
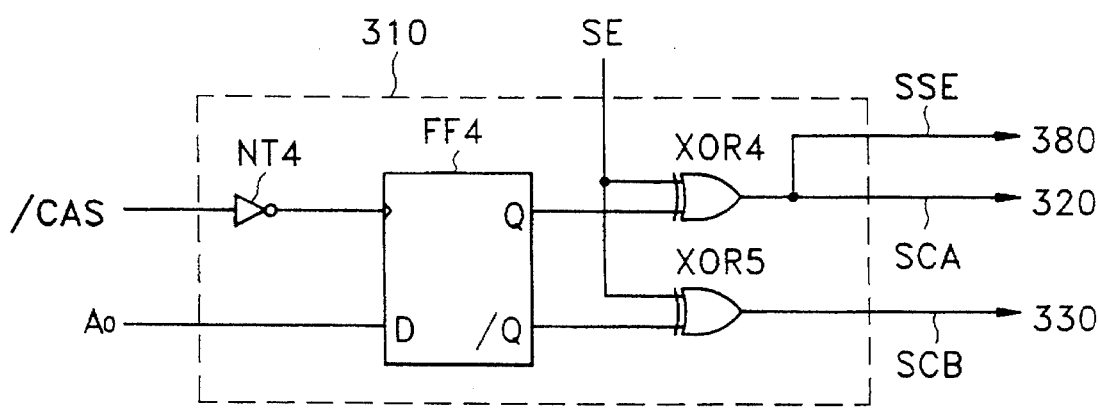
FIG. 11 is a detailed circuit diagram of the serial clock generator shown in FIG. 10.

As shown in FIG. 11, serial clock generator 310 includes a flip-flop FF14 for latching the least significant bit signal $A_0$ of external column address signal ADD at the leading edge of column address strobe signal /CAS, a first exclusive logical sum circuit XOR4 for performing an exclusive logical sum operation with respect to the output Q of the flip-flop FF14 and serial clock SC, thereby generating a first internal serial clock SCA, and a second exclusive logical sum circuit XOR5 for performing an exclusive logical sum operation with respect to inverted output/Q of the flip-flop FF14 and serial clock SC, thereby generating a second internal serial clock SCB. Inverter NT4 inverts column address strobe signal /CAS and supplies the inverted signal to the clock port of flip-flop FF14. Here, the first internal serial clock SCA is supplied as the serial input/output selection control signal SSE for alternately selecting the serial input/output data of serial input/output buffer 370.

Serial-to-parallel convertor 340a and 340b are selection circuits of four 1-to-512 registers which sequentially connect the registers to serial input/output buffer 370 in response to first and second serial selection control signals CS1 and CS2, respectively, serial-to-parallel convertor 350a and 350b are four 1-to-512 data registers for latching serial input/output data, and 360a and 360b are four 512 transmission gate circuits for gating transmission of data between the data registers and cell arrays.

That is to say, another embodiment of the present invention is adopted to a VRAM which is a dual port DRAM having a random port and a serial port. Graphics data processed in a central processing unit is written in cell arrays via input/output buffer 270 which is a random port. The graphics data written in the cell arrays is read out via serial input/output buffer 370 which is a serial port 370 to then be transmitted to a display device such as a cathode ray tube. Here, the addressing for read and write operations is performed in the same manner as that according to the aforementioned embodiment of the present invention and the data are output via serial-to-parallel convertor for a serial conversion when the addressed data are to be output serially.

Figure 12:
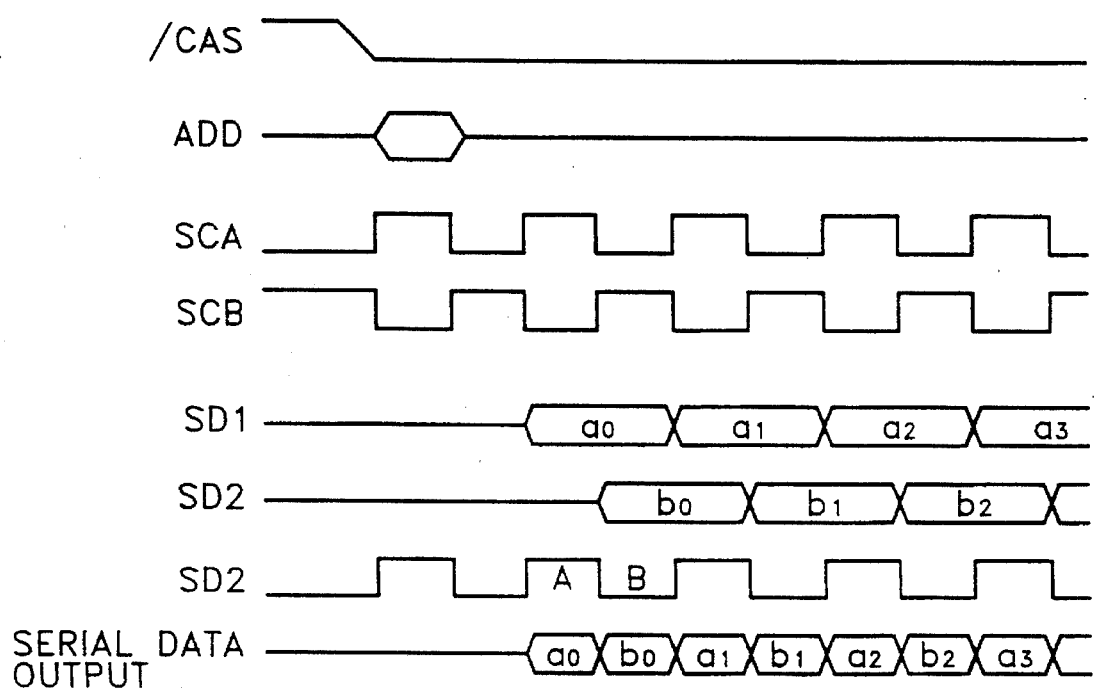
FIG. 12 shows waveform diagrams of various parts shown in FIGS. 10 and 11.

Referring to FIG. 12, during a serial output, when the state of the least significant bit signal $A_0$ of the address signal ADD is "0," since the first internal serial clock SCA leads the second internal serial clock SCB by half a cycle of the serial clock SC, data of cell block 300A is first read out and cell block 300B is pre-charged. Meanwhile, when the state of the least significant bit signal $A_0$ of the address signal ADD is "1," since the first internal serial clock SCA lags the second internal serial clock SCB by half a cycle of the serial clock SC, data of cell block 300B is first read out and cell block 300A is pre-charged. Therefore, first serial data $a_1, a_2, a_3 \ldots$ and second serial data $b_1, a_1, b_2, b_3, \ldots$ alternate with each other by half a cycle of the serial clock SC. Serial input/output buffer 370 alternately selects first and second serial data in response to the serial input/output selection control signal SSE. Then, if $A_0$ is "0," serial input/output buffer 370 outputs serial data $a_1, b_1, a_2, b_2, a_3, b_3, \ldots$, and if $A_0$ is "1," serial input/output buffer 370 outputs serial data $b_1, a_1, b_2, a_2, b_3, a_3$, As described above, according to the present invention, for the high-speed operation of a memory for storing the sequentially addressed data such as graphics data, two cell blocks are alternately addressed by means of two independent column decoders, thereby raising the column addressing speed without data collision and obtaining a stable pre-charge period. Also, external column address signal is received only once at an initial addressing time and the following column address signals are internally generated without further input, which provides for easy external control and high-speed operation.

What is claimed is:

1. An addressing method of a memory device having a plurality of cell blocks, whereby the respective cell blocks are alternately addressed, said addressing method comprising the steps of:

generating an internal row address signal of the upper (n−1)-bit signal by counting a row clock with the value of an n-bit external row address signal as an initial value in response to a row address strobe signal;

generating a first (n−1)-bit internal column address signal by counting a first column clock with the value of the upper (n−1)-bit signal of n-bit external column address signals as an initial value in response to a column address strobe signal;

generating a second internal column address signal by counting a second column clock with the value of the upper (n−1)-bit signal of the n-bit external column address signals as an initial value in response to said column address strobe signal, and generating a column clock as a selection control signal for selecting input and output signals of said plurality of cell blocks in accordance with the state of the least significant bit signal of said external column address signals;

receiving and decoding said internal row address signal, thereby addressing row addresses of said plurality of cell blocks simultaneously;

receiving and decoding said least significant bit signal of said row clock counted value and said first internal column address signal, thereby addressing the column address of one cell block of said plurality of cell blocks;

receiving and decoding said least significant bit signal of said row clock counted value and said second internal column address signal, thereby addressing the column address of the other cell block of said plurality of cell blocks; and selecting input and output signals of said plurality of cell blocks in response to said selection control signal.

2. An memory addressing method as claimed in claim 1, wherein the phase of said first column clock leads that of said second column clock by half a cycle.

3. An memory addressing method as claimed in claim 2, wherein said first column clock is in phase with an external column clock when the least significant bit signal of said external column address signal is low, and the first high period of said second column clock is extended by half a cycle immediately after the active state of said column address strobe signal and thereafter is inverted to be in phase with said external column clock, and wherein said second column clock is in phase with said external column clock when the least significant bit signal of said external column address signal is high, and said first column clock makes the latter part of the first high period of said external column clock low after the active state of said column address strobe signal and thereafter is inverted to be in phase with said external column clock.

4. An addressing method of a memory device having a random port, a serial port and a plurality of cell blocks, whereby the respective cell blocks are alternately addressed, said addressing method comprising the steps of:

generating an internal row address signal of the upper (n−1)-bit signal by counting a row clock with the value of the n-bit external row address signal as an initial value in response to a row address strobe signal;

generating a first n−1 bit internal column address signal by counting a first column clock with the value of the upper (n−1)-bit signal of the n-bit external column address signal as an initial value in response to a column address strobe signal;

generating a second internal column address signal by counting a second column clock with the value of the upper (n−1)-bit signal of the n-bit external column address signals as an initial value in response to said column address strobe signal, and generating a column clock as a selection control signal for selecting input and output signals of said plurality of cell blocks in accordance with the state of the least significant bit signal of said external column address signals;

receiving and decoding said internal row address signal, thereby addressing row addresses of said plurality of cell blocks simultaneously;

receiving and decoding said least significant bit signal of said row clock counted value and said first internal column address signal, thereby addressing the column address of one cell block of said plurality of cell blocks;

receiving and decoding said least significant bit signal of said row clock counted value and said second internal column address signal, thereby addressing the column address of the other cell block of said plurality of cell blocks;

selecting input and output signals of said plurality of cell blocks in response to said selection control signal;

generating mutually inverted first and second internal serial clocks from an external serial clock depending on the state of the least significant bit signal of external column address signal in response to said column address strobe signal;

generating a first serial selection control signal by receiving the least significant bit signal of said row address signal and said first internal column address signal and counting a first internal serial clock with the received value as an initial value;

generating a second serial selection control signal by receiving the least significant bit signal of said row address signal and said second internal column address signal and counting a second internal serial clock with the received value as an initial value;

serial-to-parallel converting row data of said one cell block in response to said first serial selection control signal;

serial-to-parallel converting row data of said another cell block in response to said second serial selection control signal; and inputting and outputting serially whereby said serial converted serial data pairs are alternately selected in response said serial input and output selection control signal.

5. An addressing method of a memory device having a pair of cell blocks, wherein said pair of cell blocks are alternately column-addressed in such a manner that the column line of one cell block among said pair of cell blocks is precharged while the column line of the other cell block is addressed, and that subsequently, the pre-charged column line of said other cell block is addressed while the next column line of said cell block is pre-charged.

6. A memory device having a plurality of cell blocks, whereby the respective cell blocks are alternately addressed, said memory device comprising:

internal row address signal generating means for generating an internal row address signal of the upper (n−1)-bit signal by counting a row clock with the value of an n-bit external row address signal as an initial value in response to a row address strobe signal;

first internal column address signal generating means for generating a first internal column address signal by counting a first column clock with the value of the upper (n−1)-bit signal of n-bit external column address signals as an initial value in response to a column address strobe signal;

second internal column address signal generating means for generating a second internal column address signal by counting a second column clock with the value of the upper (n−1)-bit signal among said n-bit external column address signals as an initial value in response to said column address strobe signal, and for generating a selection control signal for selecting input and output signals of said plurality of cell blocks by counting a column clock depending on the state of the least significant bit signal of said external column address signals;

row decoding means for receiving and decoding said internal row address signal, thereby addressing row addresses of said plurality of cell blocks simultaneously;

first column decoding means for receiving and decoding the least significant bit signal of said row clock counted value and said first internal column address signal, thereby addressing the column address of one cell block of said plurality of cell blocks;

second column decoding means for receiving and decoding the least significant bit signal of said row clock counted value and said second internal column address signal, thereby addressing the column address of the other cell block of said plurality of cell blocks;

input/output buffering means for selecting input and output signals of said plurality of cell blocks in response to said selection control signal; and control signal generating means for generating said row and column address signals, row and column clocks and an internal control signal by receiving internal row and column address strobe signals, external row and column clocks, and an external control signal.

7. A memory device as claimed in claim 6, wherein said internal row address signal generating means includes an n-bit counter for receiving an n-bit address signal in response to a load signal and counting a row clock with the received value as an initial value, and load signal generating means for generating said load signal in synchronization with said row clock and in response to said row address strobe signal.

8. A memory device as claimed in claim 6, wherein said first internal column address signal generating means includes an (n–1)-bit counter for receiving an n-bit external address signal in response to a load signal and counting a first column clock with the received value as an initial value; load signal generating means for generating said load signal in synchronization with said column clock and in response to said column address strobe signal; and first column clock generating means for generating said first column clock from said column clock depending on the state of the least significant bit signal of said external address signal.

9. A memory device as claimed in claim 8, wherein said first column clock generating means includes a first flip-flop for latching the least significant bit signal of address signal in response to the leading edge of said column address strobe signal to thereby generate a clear signal, a second flip-flop for latching a "zero" in response to the leading edge of said column address strobe signal to thereby generate a clock modulation signal in asynchronism with respect to said clear signal and a preset signal, a third flip-flop for generating said clock modulation signal as said preset signal in synchronization with said column clock, and an exclusive logical sum circuit for performing an exclusive logical sum operation with respect to said column clock and said clock modulation signal to thereby generate a first column clock.

10. A memory device as claimed in claim 6, wherein said second internal column address signal generating means includes an (n–1)-bit counter for receiving an n-bit address signal in response to a load signal and counting a second column clock with the received signal as an initial value, load signal generating means for generating said load signal in synchronization with said column clock and in response to a column address strobe signal, enabling means for performing a logical sum operation with respect to the least significant bit signal of the latched address signal and said load signal and for latching the logical sum signal in synchronization with said column clock to thereby generate the latched signal as an enabling signal of said counter, second column clock generating means for generating a second column clock from said column clock depending on the state of the least significant bit signal of said external address signal, and a selection control signal generating means for generating a selection control signal by performing an exclusive logical sum operation with respect to the least significant bit signal of said latched address signal and said column clock.

11. A memory device as claimed in claim 10, wherein said enabling signal generating means includes a logical sum circuit for performing a logical sum operation with respect to the least significant bit signal of said latched address signal and said load signal, and a flip-flop for latching the logical sum signal in synchronization with said column clock to thereby generate said latched signal as an enabling signal of said counter.

12. A memory device as claimed in claim 10, wherein said second column clock generating means includes a first flip-flop for latching the least significant bit signal of said external address signal in response to the leading edge of said column address strobe signal to thereby generate an inverted output signal of the latched signal as a clear signal, a second flip-flop for latching a "zero" in response to the leading edge of said column address strobe signal to thereby generate a clock modulation signal in asynchronism with respect to said clear signal and a preset signal, a third flip-flop for synchronizing said clock modulation signal to the inverted column clock to thereby generate said preset signal, and an exclusive logical sum circuit for performing an exclusive logical sum operation with respect to said column clock and said clock modulation signal to thereby generate a second column clock.

13. A memory device as claimed in claim 10, wherein said selection control signal generating means includes an exclusive logical sum circuit for performing an exclusive logical sum operation with respect to the least significant bit signal of said latched external address signal and said column clock to thereby generate a selection control signal.

14. A dual port memory device having a random port, a serial port and a plurality of cell blocks, said dual port memory device comprising:

internal row address signal generating means for generating an internal row address signal of the upper (n–1)-bit signal by counting row clock with the value of an n-bit external row address signal as an initial value in response to a row address strobe signal;

first internal column address signal generating means for generating a first (n–1)-bit internal column address signal by counting a first column clock with the value of the upper (n–1)-bit signal of n-bit external column address signals as an initial value in response to a column address strobe signal;

second internal column address signal generating means for generating a second internal column address signal by counting a second column clock with the value of the upper (n–1)-bit signal of said n-bit external column address signals as an initial value in response to said column address strobe signal, and for generating a selection control signal for selecting input and output signals of said plurality of cell blocks by counting a column clock depending on the state of the least significant bit signal of said external column address signals;

row decoding means for receiving and decoding said internal row address signal, thereby addressing row addresses of said plurality of cell blocks simultaneously;

first column decoding means for receiving and decoding the least significant bit signal of said row clock counted value and said first internal column address signal, thereby addressing the column address of one cell block of said plurality of cell blocks;

second column decoding means for receiving and decoding the least significant bit signal of said row clock counted value and said second internal column address signal, thereby addressing the column address of the other cell block of said plurality of cell blocks;

input and output buffering means for selecting input and output signals of said plurality of cell blocks in response to said selection control signal;

serial clock generating means for generating mutually inverted first and second internal serial clocks from external serial clock depending on the state of the least significant bit signal of external column address signal in response to said column address strobe signal;

first serial selection control signal generating means for generating a first serial selection control signal by receiving the least significant bit signal of said row address signal and said first internal column address signal and counting first internal serial clock with the received value as an initial value;

second serial selection control signal generating means for generating a second serial selection control signal by receiving the least significant bit signal of said row address signal and said second internal column address signal and counting second internal serial clock with the received value as an initial value;

first serial-to-parallel converting means for serial-to-parallel converting row data of said one cell block in response to said first serial selection control signal;

second serial-to-parallel converting means for serial-to-parallel converting row data of said another cell block in response to said second serial selection control signal;

input/output buffering means for alternately selecting said serial converted serial data pairs in response to said serial input/output serial selection control signal; and control signal generating means for generating said row and column address signals, row and column clocks and an internal control signal by receiving external row and column address strobe signals, external row and column clocks, and an external control signal.

* * * * *